United States Patent [19]
Kimura et al.

[11] Patent Number: 5,559,820
[45] Date of Patent: Sep. 24, 1996

[54] MULTIPLE QUANTUM WELL SEMICONDUCTOR LASER

[75] Inventors: Akitaka Kimura; Masaaki Nido; Akihisa Tomita; Akira Suzuki, all of Tokyo, Japan

[73] Assignee: NEC Corporation, Japan

[21] Appl. No.: 499,661

[22] Filed: Jul. 7, 1995

[30] Foreign Application Priority Data

Jul. 7, 1994 [JP] Japan ................................. 6-155920

[51] Int. Cl.[6] ............................................. H01S 3/19
[52] U.S. Cl. ....................................... 372/46; 372/45
[58] Field of Search ..................................... 372/46, 45

[56] References Cited

U.S. PATENT DOCUMENTS

| | | | |
|---|---|---|---|
| 5,375,135 | 12/1994 | Okumura et al. | 372/46 |
| 5,390,205 | 2/1995 | Mori et al. | 372/46 |
| 5,440,147 | 8/1995 | Kazmierski et al. | 372/45 |
| 5,442,649 | 8/1995 | Kokubo et al. | 372/46 |

OTHER PUBLICATIONS

A. Oishi, et al., "Low–Threshold (1.8mA) and High–Efficiency (0.39 W/A) 1.3–μm Strained Quantum Well 10–Element Laser Arrays for High–Throughput Optical Interconnections", 19th European Conference on Optical Communication Proceedings, vol. 3, pp. 21–24 (no date).

M. Hihara, et al., "Fabrication of GaAs/AlGaAs Lateral Current Injection Quantum Well Laser Diodes", Optical Measurement Technology Development Co., Ltd., 11a–ZM–10 (no date).

Y. Kawamura, et al., "Lateral Current Injection InGaAs/InAlAs MQW Lasers", NTT Opto–Electronics Laboratories, 30a–C–11 (No date).

M. Nido, et al., "Analysis of Differential Gain in InGaAs–InGaAsP Compressive and Tensile Strained Quantum–Well Lasers and Its Application for Estimation of High–Speed Modulation Limit", IEEE J. Quantum Electron., vol. 29, No. 3, Mar. 1993, pp. 885–895.

N. Tessler, et al., "On Carrier Injection and Gain Dynamics in Quantum Well Lasers", IEEE J. Quantum Electron., vol. 29, No. 6, Jun. 1993, pp. 1586–1595.

*Primary Examiner*—James W. Davie

[57] ABSTRACT

A stripe structure including an MQW active layer has a width equal to or smaller than twice the diffusion length of holes, and a p type semiconductor layer for injecting holes into the MQW active layer is formed on both sides of the stripe structure in contact with the sides of the stripe structure. Even when any MQW structure is used as the MQW active layer in order to reduce the temperature dependency of the threshold current, holes are injected into QW layers from the p type semiconductor layer which is in direct contact with all the QW layers in the MQW active layer, so that no local presence of holes in some QW layers occurs. Since the width of the stripe structure is equal to or smaller than twice the diffusion length of holes, the holes are uniformly injected in the direction parallel to the QW surface. That is, it is possible to improve the MQW active layer, while avoiding the local presence of holes, to reduce the temperature dependency of the threshold current which is accompanied with the local presence of holes in the conventional structure. This structure can reduce the temperature dependency of the threshold current of a semiconductor laser.

7 Claims, 4 Drawing Sheets

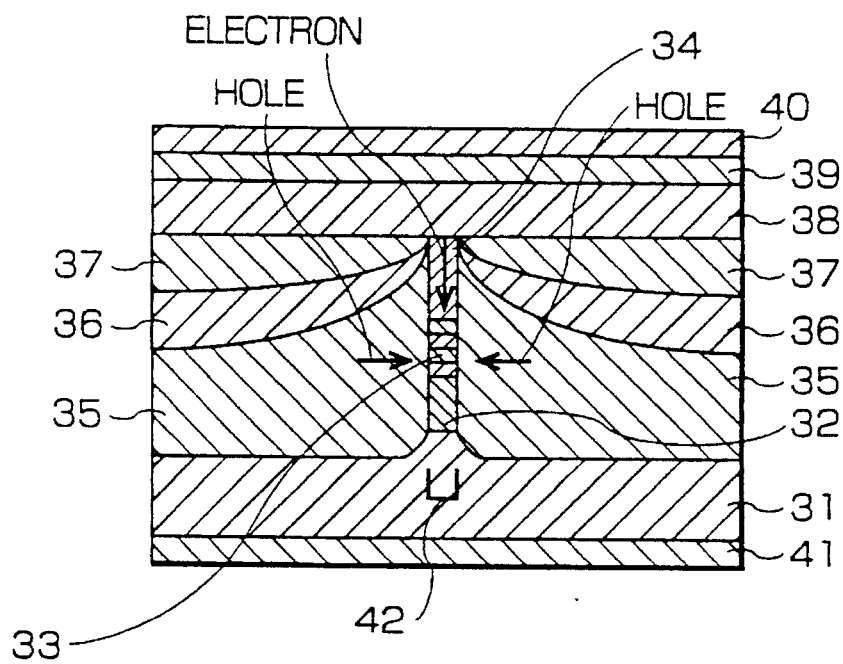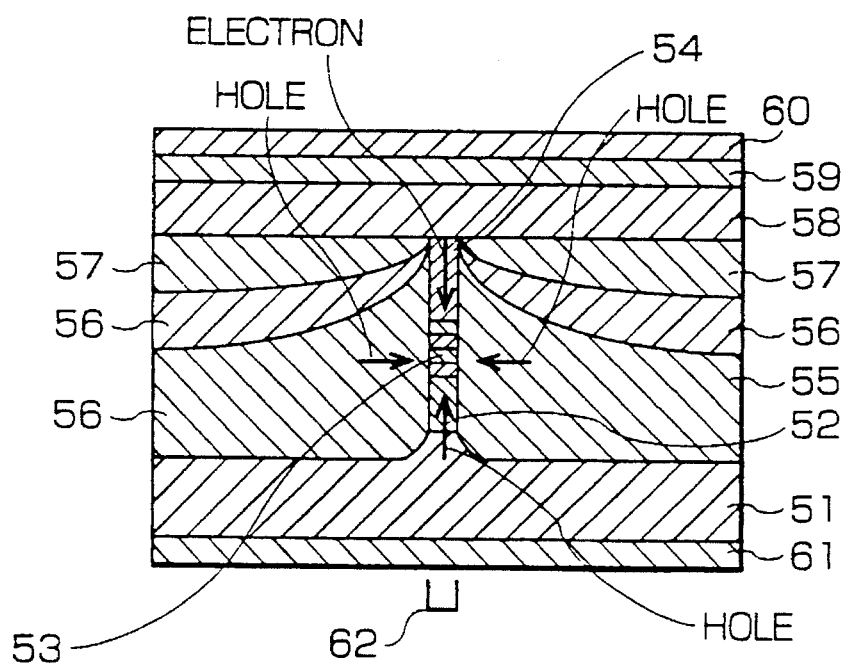

5,559,820

MULTIPLE QUANTUM WELL SEMICONDUCTOR LASER

BACKGROUND OF THE INVENTION

1. Field of the Invention

The present invention relates to a multiple quantum well (MQW) semiconductor layer (hereinafter simply called MQW laser) whose threshold current has a small temperature dependency.

2. Description of the Related Art

Recently, MQW lasers whose threshold current has a small temperature dependency are available which use an MQW structure as an active layer and have a compressive and strained quantum well (QW) layer to reduce the two-dimensional density (hereinafter referred to as $N^{2D}_{th}$) per QW layer.

FIG. 1 shows the structure of a conventional MQW laser with an oscillation wavelength of 1.3 μm, whose threshold current has a small temperature dependency, and FIG. 2 shows the structure of the MQW active layer of this MQW laser (19th European Conference on Optical Communication, Proceedings, Vol. 3, p. 21 by A. Oishi et al.). As shown in FIG. 1, the MQW laser comprises a p type InP substrate 1, a 1.5-μm wide stripe structure 12, which has a p type InP clad layer 2, an MQW active layer 3 and an n type InP clad layer 4 formed on the substrate 1, and a current block structure 13, which has a p type InP layer 5, an n type InP current block layer 6 and a p type InP layer 7 formed on both sides of this stripe structure 12. An n type InP layer 8, an n type InGaAs contact layer 9 and an n electrode 10 are formed on the stripe structure 12 and the current block structure 13. A p electrode 11 is formed at the back of the substrate 1.

As shown in FIG. 2, the MQW active layer 3 has an MQW structure in which a 20-nm thick p type InGaAsP light guide layer 21 with a bandgap wavelength of 1.15 μm and a 150-nm thick n type InGaAsP light guide layer 24 with a bandgap wavelength 1.15 μm sandwich a 5-element MQW comprising 1.4%-compressively strained five 4-nm thick InGaAsP QW layers 22, 10-nm thick four InGaAsP barrier layers 23 with a bandgap wavelength of 1.15 μm, located between the adjoining QW layers 22.

The conventional MQW laser has a temperature characteristic showing a threshold current of 1.8 mA at 25° C. and a threshold current of 4.7 mA at 80° C.

To suppress the temperature dependency of the threshold current more than the prior art, it is important to reduce the two-dimensional carrier density $N^{2D}_{th}$ per QW layer for the following reason. The threshold current is temperature dependent mainly because the temperature dependency of the ratio of the Auger recombination is large. Reducing $N^{2D}_{th}$ can lower the ratio of the Auger recombination. Theoretically, to reduce $N^{2D}_{th}$, it is effective to shorten the wavelength of the barrier layer composition (e.g., IEEE J. Quantum Electron. Vol. 29, p. 885, 1993 by M. Nido et al.).

In the MQW laser with the conventional structure as shown in FIG. 1, the p type InP clad layer 2 and the n type InP clad layer 4 for injecting the carrier into the MQW active layer 3 are not in direct contact with the individual QW layers 22. Although the p type InP layer 5 directs contacts the individual QW layers 22, the p type InP layer 5 has a thickness of about 1 μm at a location sufficiently apart from the stripe structure 12 and is thinner than about 1 μm on the sides of the stripe structure 12. Thus, the p type InP layer 5 has a high resistance. The stripe structure 12 has a greater width than the thickness of the MQW active layer 3. That is, the holes are injected into the QW layers 22 mainly from the p type InP clad layer 2, not from the p type InP layer 5. Accordingly, the carrier is diffused in the MQW structure while repeating the trapping and thermal excitation between the light guide layer 21 and barrier layers 22 and the QW layers 22, and is injected into each QW layer 22.

Since the ratio of the thermal excitation from the hole trapped state into the QW to the non-trapped state is small, the holes are locally present in some QW layers close to the p type InP clad layer 2 in the MQW active layer 3 when the carrier is injected. When the holes are locally present, electrons which have light effective mass tend to be locally present, due to the Coulomb force, in the vicinity of where the holes are locally located (e.g., IEEE J. Quantum Electron. Vol. 29, p. 1586, 1993 by N. Tessler et al.).

The local presence of the carrier is not so significant when the barrier layer composition has a long wavelength as in the case of the conventional laser shown in FIG. 1 (1.15 μm in the case of FIG. 1), but it becomes more prominent when the wavelength of the barrier layer composition is shortened further. This is because when the wavelength of the barrier layer composition becomes shorter, the ratio of the thermal excitation from the hole trapped state into the QW to the non-trapped state becomes substantially the same as the ratio of the natural discharge caused by the reuniting of the electrons and holes in the QW layers 22. The rise in $N^{2D}_{th}$ due to the local presence of the carrier is not negligible, so that actually, the shortening of the wavelength of the barrier layer composition does not always result in a reduction in the temperature dependency of the threshold current.

In other words, even when the wavelength of only the barrier layer composition in the MQW active layer 3 in the conventional structure as shown in FIG. 1 is shortened, the temperature dependency of the threshold current cannot be reduced.

SUMMARY OF THE INVENTION

Accordingly, it is an object of the present invention to provide a multiple quantum well semiconductor laser which eliminates the local presence of the carrier as in an MQW laser with the conventional structure to shorten the wavelength of the barrier layer composition of an MQW active layer, thereby reducing the temperature dependency of a threshold current.

A multiple quantum well semiconductor laser according to the first aspect of this invention comprises:

a stripe structure including an active layer having quantum well layers and barrier layers alternately stacked one on another, the stripe structure having a width equal to or smaller than about two times a diffusion length of holes; and a p type semiconductor layer, formed on both sides of the stripe structure so as to be in contact with every quantum well layer in the active layer, for injecting holes into the quantum well layers, the p type semiconductor layer being sufficiently thick on sides of the stripe structure in such a manner that an amount of holes injected into the active layer from both sides of the stripe structure becomes equal to or greater than an amount of injection from other parts.

A multiple quantum well semiconductor laser according to the second aspect of this invention comprises:

a stripe structure including an active layer having quantum well layers and barrier layers alternately stacked one on another, and two clad layers formed so as to sandwich the active layer and having a wider forbidden bandwidth and a lower refractive index than the active layer, one of the clad layers being an n type semiconductor layer for injecting electrons into the active layer while the other clad layer is a semi-insulative semiconductor layer or an insulating layer, the stripe structure having a width equal to or smaller than about two times a diffusion length of holes; and a p type semiconductor layer, formed on both sides of the stripe structure so as to be in contact with every quantum well layer in the active layer, for injecting holes into the quantum well layers.

According to the MQW laser embodying this invention, holes are injected into the QW layers from the p type semiconductor layer which is in direct contact with every QW layer in the MQW active layer, thus eliminating the undesirable local presence of holes into some QW layers. Since the width of the stripe structure is equal to or smaller than about two times the diffusion length of the holes (about 0.5 μm), the holes are uniformly injected even in the direction parallel to the QW surface in the QW layer. That is, holes are not locally present in the MQW laser of this invention. Because electrons have a greater ratio of thermal excitation and a longer diffusion length than holes, no local presence of electrons occurs if no holes are locally present. Even when the MQW structure having a barrier layer whose composition has a short wavelength is used as the active layer, therefore, no local presence of the carrier occurs in the MQW laser embodying this invention. The present MQW laser can therefore ensure lower $N^{2D}_{th}$ than the MQW laser with the conventional structure.

In the MQW laser with the conventional structure, the rise in $N^{2D}_{th}$, which is caused by the local presence of the carrier in some QW layers close to the p type clad layer, becomes prominent due to not only the shortened wavelength of the barrier layer but also multi-element structure of the MQW. It is needless to say, however, that the MQW laser embodying this invention can eliminate the local presence of the carrier. Because the multi-element structure of the MQW is also effective to reduce the temperature dependency of the threshold current, a laser with a multi-element MQW structure according to this invention is excellent in the temperature dependency of the threshold current.

Further, when the local presence of holes is avoidable, the shortened wavelength of the composition of the barrier layer and the multi-element MQW structure are effective not only in reducing the temperature dependency of the threshold current but also in improving the other characteristics of the MQW laser, such as the reduction in threshold current, the increase in modulation band and the narrowing of the oscillation line. The MQW laser embodying this invention to eliminate the local presence of holes, to shorten the wavelength of the composition of the barrier layer and to ensure the multi-element MQW structure are also excellent in those characteristics.

BRIEF DESCRIPTION OF THE DRAWINGS

FIG. 3 is a cross-sectional diagram of the structure of an MQW laser embodying the present invention;

FIG. 4 is a cross-sectional diagram of the structure of an MQW laser according to another embodiment of this invention;

DETAILED DESCRIPTION OF THE PREFERRED EMBODIMENTS

Figure 1:
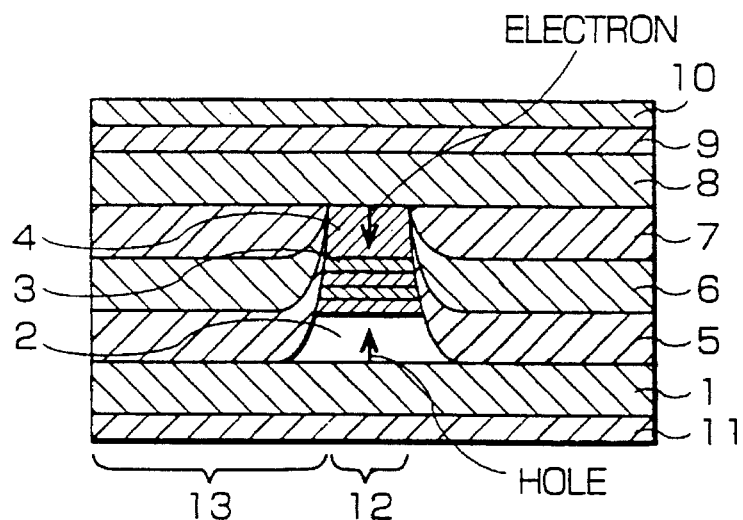
FIG. 1 is a cross-sectional diagram of the structure of a conventional MQW laser whose threshold current has a low temperature dependency.
Figure 2:
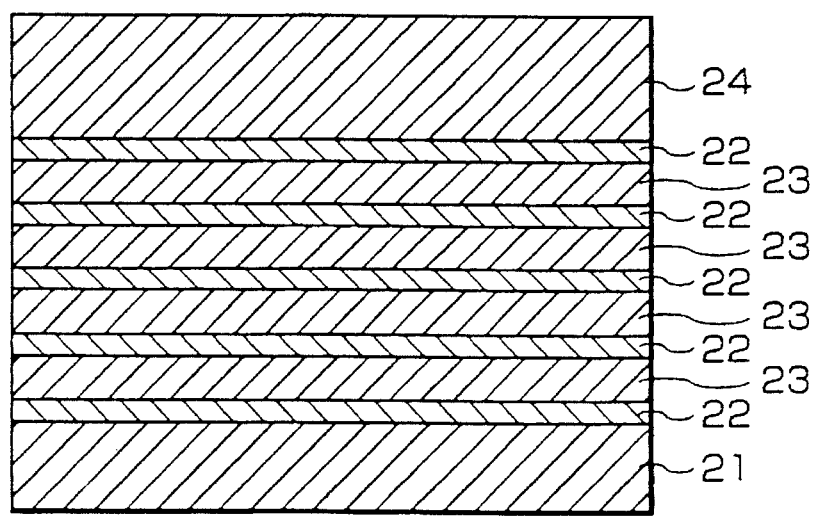
FIG. 2 is a cross-sectional diagram showing an active layer of the conventional MQW laser whose threshold current has a low temperature dependency.
Figure 5:
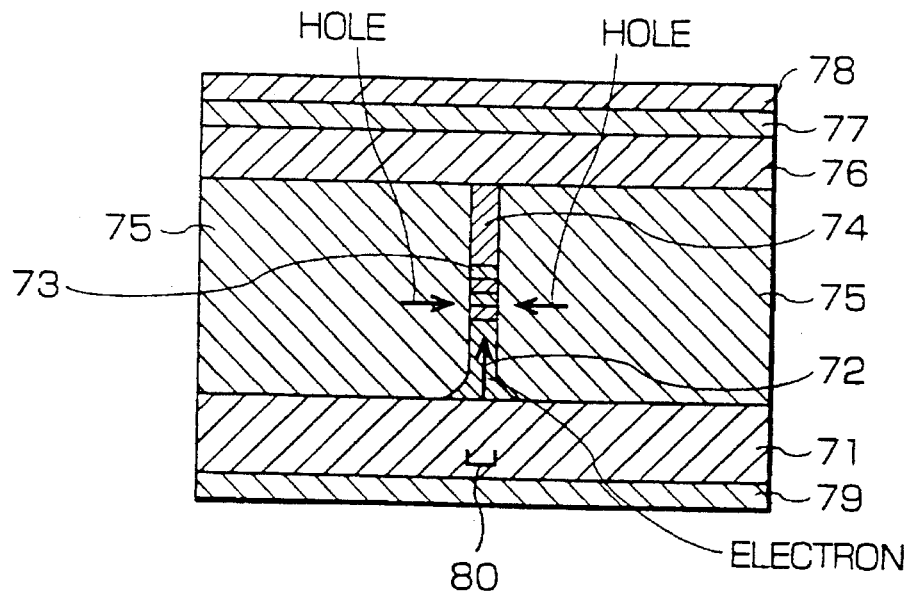
FIG. 5 is a cross-sectional diagram of the structure of an MQW laser according to a further embodiment of this invention.
Figure 6:
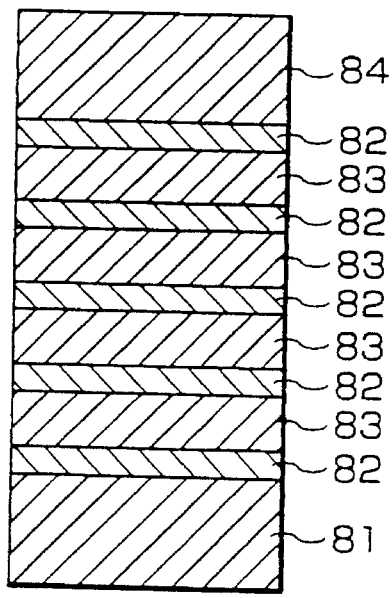
FIG. 6 is a cross-sectional diagram of an active layer of the MQW laser (FIGS. 3, 4 and 5) embodying this invention.

FIGS. 3 through 5 illustrate the structures of three types of MQW lasers with an oscillation wavelength of 1.3 μm according to this invention, and FIG. 6 shows the structure of the MQW active layer of those lasers.

FIG. 3 shows one embodiment of this invention as recited in claim 2. In FIG. 3, the MQW laser according to this embodiment comprises a p type InP substrate 31 having a direction (100) and doped with Zn at a concentration of $1\times10^{18}$ cm$^{-3}$, a 0.5-μm wide stripe structure 42, which has a semi-insulative InP clad layer 32 doped with Ti and Fe at concentrations of $5\times10^{16}$ cm$^{-3}$, an MQW active layer 33 and an n type InP clad layer 34 doped with Si at a concentration of $1\times10^{18}$ cm$^{-3}$ formed on the substrate 31, a p type InP layer 35 doped with Zn at a concentration of $1\times10^{18}$ cm$^{-3}$, an n type InP current block layer 36 doped with Si at a concentration of $1\times10^{18}$ cm$^{-3}$ and a p type InP layer 37 doped with Zn at a concentration of $1\times10^{18}$ cm$^{-3}$. The last three layers 35, 36 and 37 are formed on both sides of the stripe structure 42 in contact with the MQW active layer 33.

Formed on the stripe structure 42 and p type InP layer 37 are an n type InP layer 38 doped with Si at a concentration of $1\times10^{18}$ cm$^{-3}$, an n type InGaAs contact layer 39 doped with Si at a concentration of $1\times10^{19}$ cm$^{-3}$ and an n electrode 40. The n electrode 40 comprises a Ti layer with a thickness of 500 angstroms and an Au layer with a thickness of 400 angstroms. A p electrode 41 which likewise comprises a Ti layer with a thickness of 500 angstroms and an Au layer with a thickness of 400 angstroms is formed at the back of the substrate 31.

In this embodiment, the p type InP layer 35 is formed sufficiently thick on the sides of the stripe structure 42. Therefore, the p type InP layer 35 has a low resistance so that holes are injected into the MQW active layer 33 from the p type InP layer 35 on both sides of the stripe structure 42.

FIG. 4 shows an embodiment of this invention as recited in claim 1. The MQW laser shown in FIG. 4 comprises a p type InP substrate 51 having a direction (100) and doped with Zn at a concentration of $1\times10^{18}$ cm$^{-3}$, a 0.5-μm wide stripe structure 62, which has a p type InP clad layer 52 doped with Ti and Fe at concentrations of $5\times10^{16}$ cm$^{-3}$, an MQW active layer 53 and an n type InP clad layer 54 doped with Si at a concentration of $1\times10^{18}$ cm$^{-3}$ formed on the substrate 51, a p type InP layer 55 doped with Zn at a concentration of $1\times10^{18}$ cm$^{-3}$, an n type InP current block layer 56 doped with Si at a concentration of $1\times10^{18}$ cm$^{-3}$ and a p type InP layer 57 doped with Zn at a concentration of $1×10^{18}$ cm$^{-3}$. The last three layers 55, 56 and 57 are formed on both sides of the stripe structure 62 in contact with the MQW active layer 53. Formed on the stripe structure 62 and p type InP layer 57 are an n type InP layer 58 doped with Si at a concentration of $1×10^{18}$ cm$^{-3}$, an n type InGaAs contact layer 59 doped with Si at a concentration of $1×10^{19}$ cm$^{-3}$ and an n electrode 60. The n electrode 60 comprises a Ti layer with a thickness of 500 angstroms and an Au layer with a thickness of 400 angstroms. A p electrode 61 which likewise comprises a Ti layer with a thickness of 500 angstroms and an Au layer with a thickness of 400 angstroms is formed at the back of the substrate 51.

The p type InP layer 55 is sufficient thick on the sides of the stripe structure 62 and thus has a low resistance there, holes are injected into the MQW active layer 53 from the p type InP clad layer 52 and the p type InP layer 55 on both sides of the stripe structure 62.

FIG. 5 shows another embodiment of this invention as recited in claim 2. The MQW laser shown in FIG. 5 comprises an n type InP substrate 71 having a direction (100) and doped with Sn at a concentration of $2×10^{18}$ cm$^{-3}$, a 0.5-μm wide stripe structure 80, which has an n type InP clad layer 72 doped with Si at a concentration of $1×10^{18}$ cm$^{-3}$, an MQW active layer 73 and a semi-insulative InP clad layer 74 doped with Ti and Fe at concentrations of $5×10^{16}$ cm$^{-3}$, formed on the substrate 71, and a p type InP layer 75 doped with Zn at a concentration of $1×10^{18}$ cm$^{-3}$, formed on both sides of the stripe structure 80 in contact with the MQW active layer 73. Formed on the stripe structure 80 and p type InP layer 75 are a p type InP layer 76 doped with Zn at a concentration of $1×10^{13}$ cm$^{-3}$, a p type InGaAs contact layer 77 doped with Zn at a concentration of $1×10^{19}$ cm$^{-3}$ and a p electrode 78. The p electrode 78 comprises a Ti layer with a thickness of 500 angstroms and an Au layer with a thickness of 400 angstroms. An n electrode 79 which likewise comprises a Ti layer with a thickness of 500 angstroms and an Au layer with a thickness of 400 angstroms is formed at the back of the substrate 71.

Holes are injected into the MQW active layer 73 from the p type InP layer 75 on both sides of the stripe structure 80.

FIG. 6 shows the internal structures of the MQW active layers 33, 53 and 73 in the embodiments shown in FIGS. 3, 4 and 5. The active layer shown in FIG. 4 has an MQW structure in which a 20-nm thick InGaAsP light guide layer 81 with a bandgap wavelength of 1.15 μm and a 200-nm thick InGaAsP light guide layer 84 with a bandgap wavelength 1.05 μm sandwich a 5-element MQW each element comprising 1.4%-compressively strained 4-nm thick InGaAsP QW layer 82 and a 10-nm thick InGaAsP barrier layer 83 with a bandgap wavelength of 1.05 μm.

According to the MQW laser with the structure of this invention, holes are injected into the QW layers 82 from the p type semiconductor layer (p type InP layer 35, 55 or 75) which is in contact with all the QW layers 82 in the MQW stripe structure (42, 62 or 80) (see FIGS. 3, 4 and 5), thus preventing the holes from being locally present in the QW layer close to the p type InP clad layer. Since the stripe structure of the MQW laser embodying this invention is as narrow as 0.5 μm in the embodiments shown in FIGS. 3, 4 and 5, which is equal to or smaller than the diffusion length of the holes (about 0.5 μm), the holes are uniformly injected even in the direction parallel to the QW surface in the QW layer. Because electrons have a greater ratio of thermal excitation and a longer diffusion length than holes, no local presence of electrons occurs if no holes are locally present.

The application of the present invention is not limited only to the MQW laser having the MQW active layer shown in FIG. 6. This invention may also be adapted for an MQW laser different from the MQW laser having the MQW active layer. For example, the QW layer may have a different thickness and a different InGaAsP composition from those of the above-described embodiments. The barrier layer may have a different thickness and a different InGaAsP composition from those of the above-described embodiments. Further, the light guide layer may have a different thickness and a different InGaAsP composition from those of the above-described embodiments. Furthermore, the number of QW layers in the MQW structure is not limited to the one employed in the above-described embodiments and this invention may be embodied into an MQW laser whose MQW active layer has a different number of QW layers.

Accordingly, this invention is not limited to an MQW laser having an oscillation wavelength of 1.3 μm, but may be adapted for any MQW laser that has, as an active layer, an MQW structure in which the QW layer is an InGaAsP layer and the barrier layer is an InGaAsP layer. The dopant and the doping concentration of each semiconductor layer should not necessarily be those of the embodiments shown in FIGS. 3, 4 and 5, but may be changed without raising any problems as long as the individual semiconductor layers serve their purposes such as the injection of the carrier into the active layer and the blocking of the leak current.

The working of this invention does not require that the InP substrate should have the direction (100) as in the three embodiments illustrated in FIGS. 3, 4 and 5. This invention can be embodied into an MQW laser formed on an InP substrate having a different direction from (100) without problems. It is readily understood that this invention can be embodied into an MQW laser in which the QW layer of the MQW active layer, the barrier layer or the light guide layer is other than the InGaAsP layer without problems, as long as such layer is formed on the InP substrate.

This invention can also be embodied into an MQW laser formed on a substrate other than the InP substrate. An embodiment covering this feature is illustrate in FIG. 7 in which an MQW laser having an oscillation wavelength of 690 nm is formed on a GaAs substrate. FIG. 6 shows the structure of the MQW active layer of this MQW laser. This embodiment is another embodiment of the invention as recited in claim 1.

Figure 7:
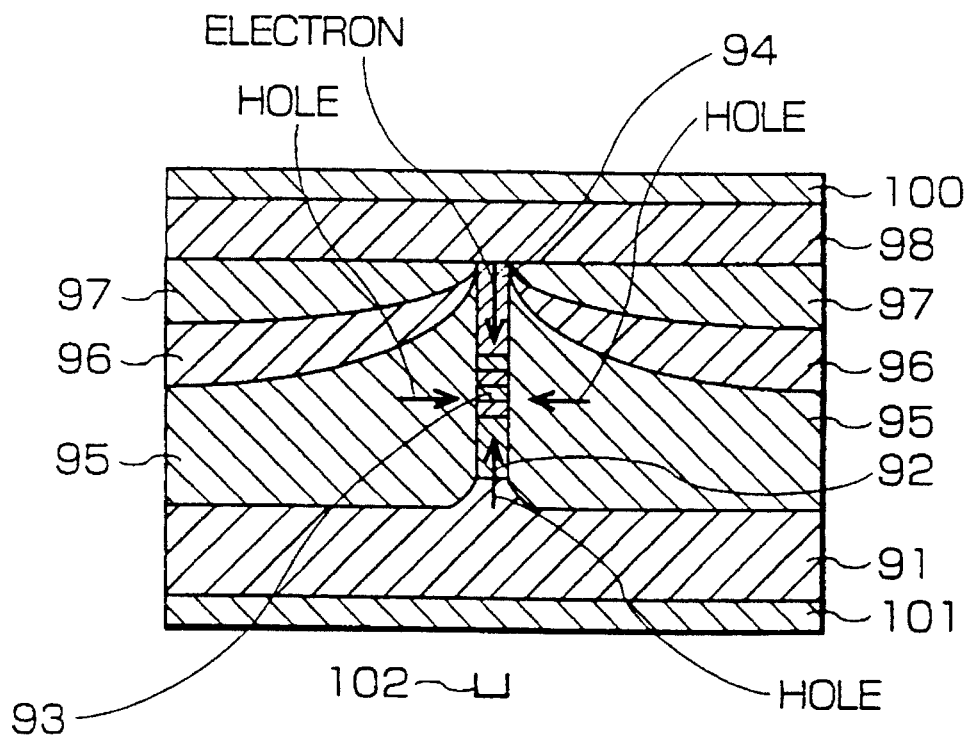
FIG. 7 is a cross-sectional diagram of the structure of an MQW laser according to a still further embodiment of this invention.

The MQW laser shown in FIG. 7 comprises a p type GaAs substrate 91 having a direction (100) and doped with Zn at a concentration of $1×10^{18}$ cm$^{-3}$, a 0.5-μm wide stripe structure 102, which has a semi-insulative $(Al_{0.6}Ga_{0.4})_{0.5}In_{0.5}P$ clad layer 92 doped with Ti and Fe at concentrations of $5×10^{16}$ cm$^{-3}$, an MQW active layer 93 and an n type $(Al_{0.6}Ga_{0.4})_{0.5}In_{0.5}P$ clad layer 94 doped with Si at a concentration of $2×10^{17}$ cm$^{-3}$ formed on the substrate 91, a p type $(Al_{0.6}Ga_{0.4})_{0.5}In_{0.5}P$ layer 95 doped with Zn at a concentration of $1×10^{18}$ cm$^{-3}$, an n type $(Al_{0.6}Ga_{0.4})_{0.5}In_{0.5}P$ current block layer 96 doped with Si at a concentration of $2×10^{17}$ cm$^{-3}$ and a p type $(Al_{0.6}Ga_{0.4})_{0.5}In_{0.5}P$ layer 97 doped with Zn at a concentration of $1×10^{18}$ cm$^{-3}$. The last three layers 95, 96 and 97 are formed on both sides of the stripe structure 102 in contact with the MQW active layer 93. Formed on the stripe structure 92 and p type $(Al_{0.6}Ga_{0.4})_{0.5}In_{0.5}P$ layer 97 are an n type $(Al_{0.6}Ga_{0.4})_{0.5}In_{0.5}P$ layer 98 doped with Si at a concentration of $1×10^{13}$ cm$^{-3}$ and an n electrode 100, which comprises a TiGeNi layer with a thickness of 500 angstroms, an AuNi layer with a thickness of 100 angstroms, a Cr layer with a thickness of 500 angstroms and an Au layer with a thickness of 4000 angstroms. A p electrode 101 which likewise comprises a Ti layer with a thickness of 700 angstroms, a Ti layer with a thickness of 1000 angstroms and an Au layer with a thickness of 4000 angstroms is formed at the back of the substrate 91.

As the p type $(Al_{0.6}Ga_{0.4})_{0.5}In_{0.5}P$ layer 95 is sufficiently thick and has a low resistance on the sides of the stripe structure 102, holes are injected into the MQW active layer 93 from the p type $(Al_{0.6}Ga_{0.4})_{0.5}In_{0.5}P$ layer 95 on both sides of the stripe structure 102.

Figure 8:
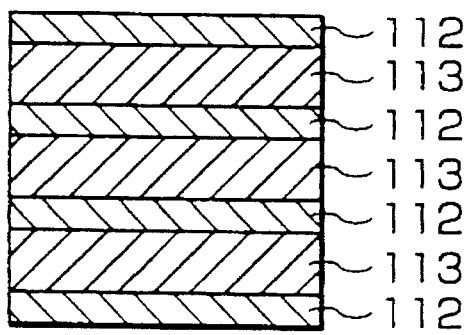
FIG. 8 is a cross-sectional diagram of an active layer of the MQW laser (FIG. 7) embodying this invention.

FIG. 8 shows the internal structure of the MQW active layer 93 in the embodiment shown in FIG. 7. In FIG. 8, the active layer has a 4-element MQW structure in which each element comprises a 0.3%-compressively strained 10-nm thick $(Al_{0.6}Ga_{0.4})_{0.5}In_{0.5}P$ QW layer 112 and a 5-nm thick $(Al_{0.6}Ga_{0.4})_{0.5}In_{0.5}P$ barrier layer 113.

The embodiments of this invention are not limited to MQW lasers whose active layers are formed of elements of group III and group V, but this invention may be adapted for an MQW laser whose active layer is formed of different elements such as elements of group II and group VI, without problems.

What is claimed is:

1. A multiple quantum well semiconductor laser comprising:

a stripe structure including an active layer having quantum well layers and barrier layers alternately stacked one on another, said stripe structure having a width equal to or smaller than about two times a diffusion length of holes; and a p type semiconductor layer, formed on both sides of said stripe structure so as to be in contact with every quantum well layer in said active layer, for injecting holes into said quantum well layers, said p type semiconductor layer being sufficiently thick on sides of said stripe structure in such a manner that an amount of holes injected into said active layer from both sides of said stripe structure becomes equal to or greater than an amount of injection from other parts.

2. The multiple quantum well semiconductor laser according to claim 1, wherein said quantum well layer is an InGaAs quantum well layer.

3. The multiple quantum well semiconductor laser according to claim 1, wherein said barrier layer is an InGaAs barrier layer.

4. The multiple quantum well semiconductor laser according to claim 1, wherein said p type semiconductor layer is a p type InP layer.

5. A multiple quantum well semiconductor laser comprising:

a stripe structure including an active layer having quantum well layers and barrier layers alternately stacked one on another, and two clad layers formed so as to sandwich said active layer and having a wider forbidden bandwidth and a lower refractive index than said active layer, one of said clad layers being an n type semiconductor layer for injecting electrons into said active layer while the other clad layer is a semi-insulative semiconductor layer or an insulating layer, said stripe structure having a width equal to or smaller than about two times a diffusion length of holes; and a p type semiconductor layer, formed on both sides of said stripe structure so as to be in contact with every quantum well layer in said active layer, for injecting holes into said quantum well layers.

6. The multiple quantum well semiconductor laser according to claim 5, wherein said n type semiconductor layer is an n type InP clad layer.

7. The multiple quantum well semiconductor laser according to claim 5, wherein said semi-insulative semiconductor layer is a semi-insulative InP clad layer.

* * * * *